United States Patent [19]

Kim et al.

[11] Patent Number: 5,591,675
[45] Date of Patent: Jan. 7, 1997

[54] INTERCONNECTING METHOD FOR SEMICONDUCTOR DEVICE

[75] Inventors: Jae-woo Kim, Suwon; Joon Kim, Seoul; Jin-hong Kim, Suwon, all of Rep. of Korea

[73] Assignee: Samsung Electronics Co., Ltd., Suwon, Rep. of Korea

[21] Appl. No.: 361,835

[22] Filed: Dec. 22, 1994

[30] Foreign Application Priority Data

Dec. 22, 1993 [KR] Rep. of Korea ............... 93-29052

[51] Int. Cl.⁶ .................................................. H01L 21/44
[52] U.S. Cl. ...................... 437/195; 437/194; 156/644.1; 148/DIG. 161
[58] Field of Search ........................... 437/195, 194, 437/235, 947, 981; 156/644.1; 148/DIG. 161

[56] References Cited

U.S. PATENT DOCUMENTS

| | | | |
|---|---|---|---|
| 4,814,041 | 3/1989 | Auda | 156/643.1 |
| 4,857,141 | 8/1989 | Abe et al. | 156/644.1 |
| 4,938,839 | 7/1990 | Fujimura et al. | 156/628 |
| 5,312,775 | 5/1994 | Fujii et al. | 437/192 |
| 5,420,078 | 5/1995 | Sikora | 437/228 |

FOREIGN PATENT DOCUMENTS 1-192134  8/1989  Japan.

OTHER PUBLICATIONS

Stanley Wolf, "Silicon Processing for the VLSI Era vol. I" Lattice Press (Calif.) (1986) p. 523.

*Primary Examiner*—George Fourson
*Assistant Examiner*—C. Everhart
*Attorney, Agent, or Firm*—Cushman Darby & Cushman, L.L.P.

[57] ABSTRACT

An interconnecting method for a semiconductor device is disclosed in which a conductive layer containing aluminum is formed on a lower structure formed on a substrate. An insulating layer is formed on the conductive layer. A photoresist pattern for defining a portion where an opening is to be made is formed on the insulating layer. Then, the insulating layer is isotropically etched by wet etching with the photoresist pattern as an etching mask. The insulating layer remaining after the isotropical etching is taper-etched by RIE to form the opening. To ensure that the conductive layer is exposed by the opening, the resultant structure is overetched by using a mixed gas of fluorocarbon-containing gas and oxygen. This resultant structure is RIE-sputtered using fluorocarbon-containing gas such that polymer or nonvolatile by-products generated when the opening such as a via hole is formed, are completely removed.

4 Claims, 2 Drawing Sheets

INTERCONNECTING METHOD FOR SEMICONDUCTOR DEVICE

BACKGROUND OF THE INVENTION

The present invention relates to an interconnecting method for a semiconductor device, and more particularly, to a method for forming an opening in an insulating layer formed on a conductive layer containing aluminum.

With the development of semiconductor technology to the LSI or VLSI scale, a semiconductor device usually has a multi-level conductive layer. If the conductive layer is formed at multiple levels, a via hole, serving as a contact passage, is formed in an insulating layer placed between upper and lower conductive layers to thereby connect upper and lower conductive layers.

FIGS. 1A–1E are sectional views for illustrating a general method for forming a via hole on a conductive layer made of a material containing aluminum.

Referring to FIG. 1A, a lower conductive layer 11 and a photoresist pattern 13 are formed. Specifically, FIG. 1A shows the steps of depositing a conductive material containing aluminum, i.e., aluminum or an aluminum alloy, on a lower structure 10 formed on a semiconductor substrate (not shown) to thereby form a lower conductive layer 11, coating an insulating material such as silicon oxide on lower conductive layer 11 to thereby form an insulating layer 12, coating a photoresist layer on insulating layer 12, and patterning the photoresist layer by an ordinary photolithography technique to thereby form a photoresist pattern 13 where a window through which the insulating layer placed on a via-hole-forming portion is exposed to the surface is formed.

FIG. 1B illustrates a step of forming the top portion 14 of the via hole. Here, a wet etching is performed on the insulating layer with photoresist pattern 13 acting as an etching mask, thereby isotropically etching insulating layer 12 by a predetermined thickness. This forms the top portion 14 of the via hole.

FIG. 1C illustrates a step of forming the bottom portion 15 of the via hole. In this step, the remaining insulating layer is etched until the top surface of the lower conductive layer 11 is exposed, by an anisotropical etching like reactive ion etching (RIE), thereby forming the bottom 15 of the via hole. Then, to insure that lower conductive layer 11 is fully exposed, some degree of over-etching is performed on the lower conductive layer.

FIG. 1D illustrates a step of removing the photoresist pattern. This step includes removing the photoresist pattern (reference number 13 of FIG. 1C) in an ordinary way, by ashing with $O_2$ plasma and stripping with a chemical solution.

FIG. 1E illustrates a step of forming upper conductive layer 18, by depositing a conductive material on the resultant structure.

As the packing density of a semiconductor device increases, an area of the plane of the via hole decreases whereas its aspect ratio increases. For this reason, the step coverage of a conductive material to be deposited on the via hole becomes poor, and a void may be created.

In order to reduce the aspect ratio of a via hole, as discussed in the aforementioned general method for forming the via hole, the top portion of the via hole is formed via isotropic etching and the bottom portion thereof is anisotropically etched, so that the top of the via hole has a larger diameter than its bottom.

As another result of semiconductor devices being packed more densely, the topography of a lower conductive layer becomes more uneven. This is due to the lower structure. Thus, the insulating layer formed thereon has different thicknesses in different portions.

In forming a via hole for interconnecting the upper and lower conductive layers, if the insulating layer formed on the lower conductive layer in a specific portion is thinner than that formed on some other portion of the lower conductive layer, the etching process for forming the via hole must still conform to the thicker portions in order to reliably secure the connection of the upper and lower conductive layers. Therefore, the via hole formed on the thinner portion of the insulating layer is relatively over-etched as compared with one formed on the thicker portion. That is, the etching should continue even after the completion of the thinner-location via hole because the thicker-location via hole is not yet completely formed, so that the surface of the lower conductive layer formed on the portion where the thinner insulating layer is formed is etched by a certain depth (over-etched).

For the etching for forming the via hole, a fluorocarbon-containing gas such as $CF_4$ or $CHF_3$ is generally used. During etching, these gases react with a material of the insulating layer, thereby producing a polymer having a structural formula of $CF_X$ where X is 2, 3 or 4. Particularly, in over-etching, the gases react with aluminum activated in the exposed conductive layer, thereby producing a nonvolatile by-product such as $AlF_3$. The amount of the nonvolatile by-product increases as the amount of over-etching increases.

The polymer produced in the etching of the insulating layer is easy to remove in a succeeding process. However, the nonvolatile by-product generated by the reaction of aluminum and gas is not completely removed even by the succeeding process of ashing and stripping, and remains stuck to the surface of the conductive layer inside the via hole. This remaining by-product prevents proper electric connection in a succeeding interconnection process, thus increasing the rate of defective products and reducing the reliability of a manufactured semiconductor device.

In FIGS. 1C–1E, reference number 16 represents the polymer by-product of the etching of the insulating layer, and reference number 17 indicates the nonvolatile by-product generated in the over-etching process.

The generation of nonvolatile by-product can be prevented by depositing another metal layer on the lower conductive layer, such that the lower conductive layer is not formed only of a metal material containing aluminum. Therefore, the metal material containing aluminum is not directly etched in the over-etching for forming the via hole. For instance, in U.S. Pat. No. 4,948,459 (filed on Jan. 4, 1989 and entitled "Method of Enabling Electrical Connection to a Substructure Forming Part of an Electronic Device" by Josephus M. F. G. van Laarhoven et al.), a second conductive layer made of a material not containing aluminum, for instance, titanium or tungsten, is formed on a first conductive layer containing aluminum so that the first conductive layer is not directly exposed to plasma when forming a via hole. This prevents by-product from being created. This added step, however, further complicates the process.

SUMMARY OF THE INVENTION

Therefore, it is an object of the present invention to provide an interconnecting method for a semiconductor device for completely removing by-products such as polymer and a nonvolatile by-product generated during an etching step, in forming an opening in an insulating layer on a conductive layer containing aluminum.

It is another object of the present invention to provide an interconnecting method for a semiconductor device having an excellent step coverage.

To accomplish the above objects, there is provided an interconnecting method for a semiconductor device comprising the steps of: forming a conductive layer containing aluminum on a lower structure; forming an insulating layer on the conductive layer; forming a photoresist pattern which exposes the insulating layer formed on a portion where an opening is to be formed, on the insulating layer; etching the insulating layer using the photoresist pattern as an etching mask until the conductive layer is exposed, thereby forming the opening; and RIE-sputtering the resultant structure.

In the embodiment of an interconnecting method for a semiconductor device of the present invention, the step of forming the opening comprises the sub-steps of: isotropically etching part of the insulating layer by wet etching using the photoresist pattern as an etching mask; and etching the remainder of the isotropically etched insulating layer by RIE such that the diameter of the opening tapers downward.

The embodiment of an interconnecting method for a semiconductor device of the present invention, further comprises, after the step of tapering etching, a step of over-etching the resultant structure to ensure the exposure of the conductive layer by the opening. The over-etching step is performed under a condition where the etching selection ratio of the photoresist to the insulating layer is below one, in order to secure a tapering effect, and by using $CF_4/O_2$ mixed gas.

The embodiment of an interconnecting method for a semiconductor device of the present invention further comprises, after the step of forming the conductive layer, a step of forming a titanium nitride layer on the conductive layer.

In the embodiment of an interconnecting method for a semiconductor device, the RIE sputtering step is performed under a condition where the etching selection ratio of the photoresist to the RIE sputtering is higher than that of the insulating layer.

More specifically, the insulating layer is formed of silicon oxide. The RIE sputtering step is performed with an RF power of 1,500–2,000 W and by using $O_2/CHF_3$ mixed gas whose $O_2$ content is above 70%.

The embodiment of an interconnecting method for a semiconductor device further comprises, after the RIE sputtering step, the steps of ashing with $O_2$ plasma, stripping by wet etching, and coating a conductive material on the resultant structure, to thereby form a second conductive layer.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1A:
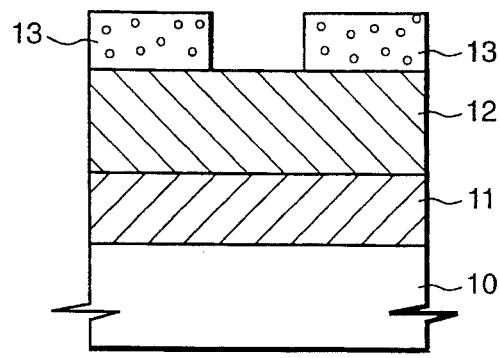
FIGS. 1A–1E are sectional views for illustrating a general method for forming a via hole on a conductive layer made of a material containing aluminum.
Figure 1B:
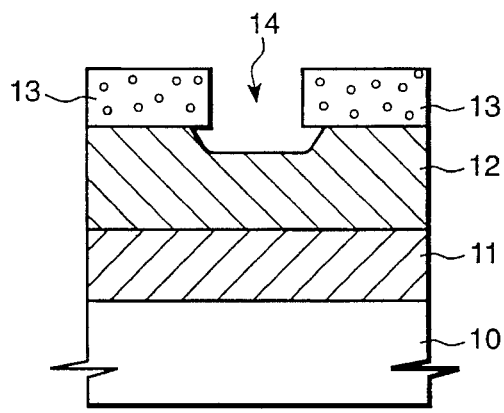
Figure 1C:
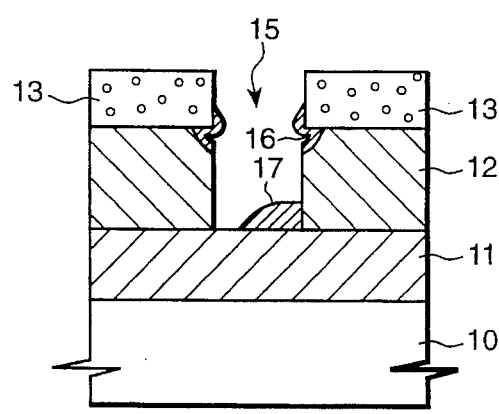
Figure 1D:
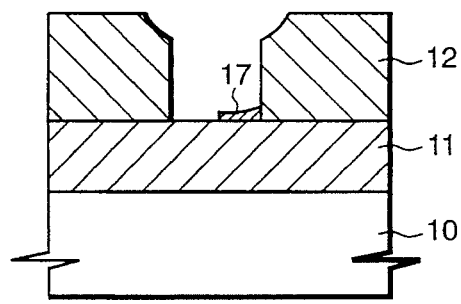
Figure 1E:
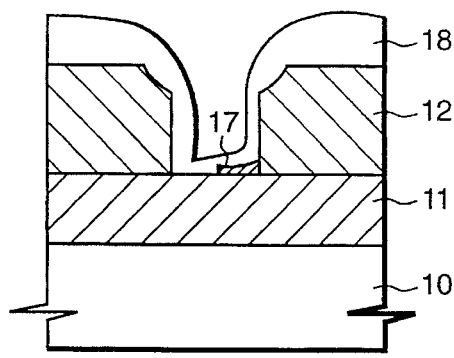
Figure 2A:
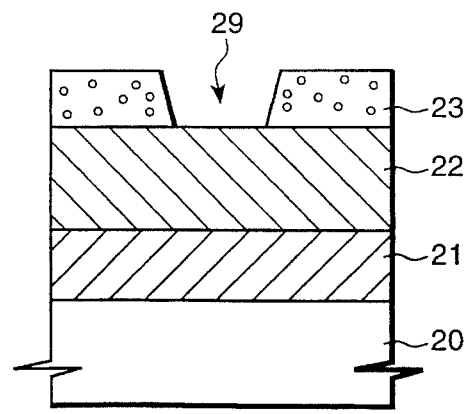
FIGS. 2A–2F are sectional views for illustrating one embodiment of an interconnecting method for a semiconductor device of the present invention.

FIG. 2A illustrates a process of forming a lower conductive layer 21, insulating layer 22 and photoresist pattern 23. First, in order to form lower conductive layer 21, a conductive material containing aluminum is deposited on a lower structure 20 formed on a semiconductor substrate (not shown), for instance, by sputtering or chemical vapor deposition (CVD). Subsequently, in order to form insulating layer 22, an insulating material such as silicon oxide or silicon nitride is deposited on lower conductive layer 21, for instance, by plasma-enhanced chemical vapor deposition (PECVD). In order to form photoresist pattern 23 having a window 29 for exposing the insulating layer formed on a portion where the opening such as a via hole is to be formed, a photoresist layer is formed on insulating layer 22 and patterned by an ordinary photolithography technique.

Here, the conductive material of lower conductive layer 21 is pure aluminum or an aluminum alloy like Al—Si—Cu alloy or Al—Si—Ti alloy. Lower conductive layer 21 may be formed evenly like a plate as shown in the drawing, or, if necessary, patterned to form a conductive layer pattern of a predetermined shape. In addition, titanium nitride (TiN) may be deposited on lower conductive layer 21, thereby forming a TiN layer 28 (see FIG. 3). The purpose of such a layer is to reduce the reflectance of the lower conductive layer containing aluminum and increase the resolution of photoresist, in a lithography process for patterning the lower conductive layer.

It is preferable that the upper diameter (the top surface side of photoresist pattern 23) of window 29 is greater than its lower diameter (the bottom surface of the photoresist pattern).

Figure 2B:
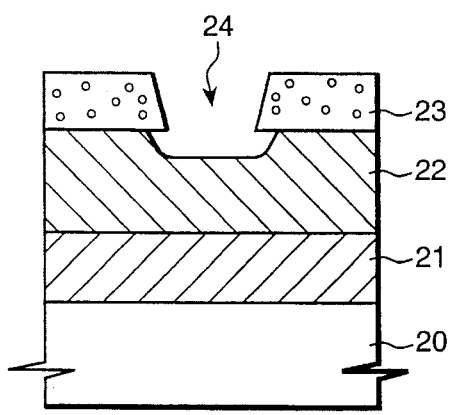

FIG. 2B illustrates a step of forming the top portion 24 of the opening, A wet etching is performed with photoresist pattern 23 acting as an etching mask, to thereby etch insulating layer 22 by a predetermined depth. Here, an etching solution used in the wet etching is, for instance, HF or buffered oxide etchant (BOE). Since wet etching is one kind of isotropic etching, the surface of an insulating layer so etched is recessed hemispherically. This allows the entrance of the opening to become wider, resulting in reducing the aspect ratio of the opening. (In FIG. 2B, though only one opening is shown, the embodiment includes the forming of several openings simultaneously.)

Figure 2C:
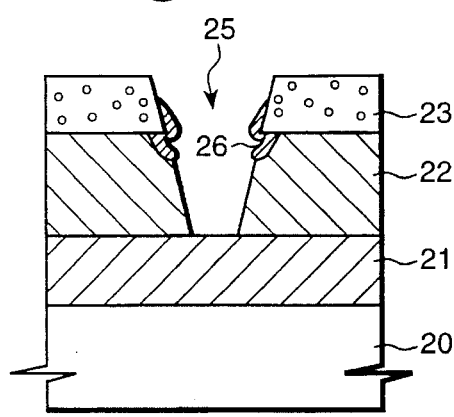

FIG. 2C illustrates a step of taper etching the portion of insulating layer 22 remaining under the etched top portion (see reference number 24 of FIG. 2B) of the opening, by reactive ion etching, thereby forming the bottom portion 25 of the opening whose diameter tapers downward. The etching end point is the top surface of lower conducting layer 21.

If, for instance, insulating layer 22 is made of silicon oxide, the above RIE process for forming the tapering diameter uses $O_2/CHF_3$ mixed gas having a relatively low $O_2$ gas content (i.e., lower than that of general $O_2/CHF_3$ mixed gas). Here, the $O_2$ gas content is preferably less than 15% of the total gas mixture of $O_2$ and $CHF_3$.

The tapered opening allows the by-products (reference numerals 26 and 27) to be easily removed by RIE sputtering which is performed to eliminate the by-products (see FIG. 2E), and improves the step coverage of a conductive layer in a succeeding step of filling the opening with conductive material to form a conductive layer.

The method for etching the insulating layer to form a tapered opening having inwardly sloped sidewalls is a well-known technology. For instance, in U.S. Pat. No. 4,978,420 (filed on Jan. 3, 1990 and entitled "Single Chamber Via Etch through a Dual-layer Dielectric" by Valerie A. Bach), a dual-layer dielectric made of an silicon oxide layer and a silicon nitride layer is etched to form a via hole having a tapered sidewall profile. This method can be employed in the present invention in order to form the desired tapered opening.

Figure 2D:
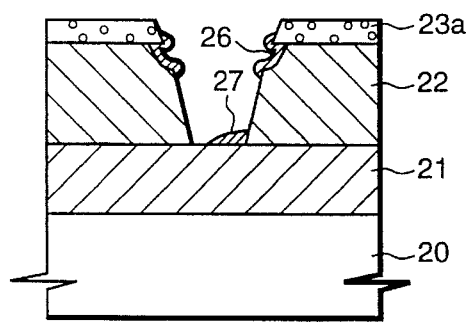

In FIG. 2D, in order to ensure that lower conductive layer 21 is exposed, the $O_2/CHF_3$ mixed gas used in the etching of the insulating layer is replaced with $CF_4/O_2$ mixed gas and the lower conductive layer is over-etched.

The tapering etching discussed in connection with FIG. 2C is carried out assuming the thinner portions of the insulating layer as a reference. Thus, for openings formed where the thickness of the insulating layer is relatively thin, the lower conductive layer is sufficiently exposed through the tapering etching only. However, when an opening is formed on a thicker portion of the insulating layer, the lower conductive layer is not fully exposed even after the tapering etching. The over-etching is intended to overcome this problem, so that openings to be formed on the substrate are all completely formed.

The $CF_4/O_2$ mixed gas used for the over-etching is preferably controlled such that the etching selection ratio of the insulating layer to the photoresist with respect to a predetermined etching is low (nearly 1:1). If $CF_4/O_2$ mixed gas is used, fewer by-products are generated than if $O_2/CHF_3$ mixed gas is used. As mentioned above, when the etching rate is controlled such that the etching selection ratio of the insulating layer to the photoresist is low, the photoresist can also be etched in the over-etching, to thereby reduce the angle of the sidewalls of the opening. In FIG. 2D, reference numeral 26 indicates the by-product of a polymer generated in the insulating layer etching step. Reference numeral 27 represents the nonvolatile by-product generated in the over-etching.

Figure 2E:
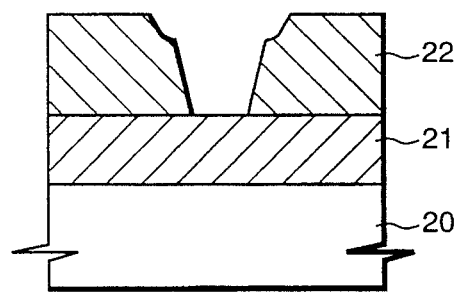

FIG. 2E illustrates a step of removing the polymer, the nonvolatile by-product, and the photoresist pattern. This step is carried out when a controlled RIE sputtering is performed on the resultant structure. Here, conditions are controlled such that the etching selection ratio of the photoresist to insulating layer 22 is high (i.e., greater than 5:1). By doing this, by-products 26 and 27 generated in the etching or over-etching are removed together with photoresist pattern 23a which remains after the over-etching step.

Here, the RIE sputtering step is performed, specifically, by using a gaseous mixture of fluorocarbon-containing gas and oxygen having a high $O_2$ content, and with an increased RF power. More specifically, when insulating layer 22 is made of, for instance, silicon oxide, it is preferable to use $O_2/CHF_3$ mixed gas whose $O_2$ content is above 70%. It is more preferable that the RF power is 1,550–2,000 W.

While the aforementioned RIE etching (see FIG. 2C) is one where radicals and ions activated within plasma are reacted with the ions dangling-bonded to the lower layer (etching target) and are volatilized, the RIE sputtering is one where particles are sputtered by physical impact without chemical reaction by radicals. This method, as compared with an ordinary physical sputtering, is advantageous in that the by-products are removed simultaneously with the photoresist pattern.

Subsequently, by performing ashing with $O_2$ plasma and stripping by wet etching, an opening with no remaining polymer deposits or nonvolatile by-product can be obtained as shown in FIG. 2E.

Figure 2F:
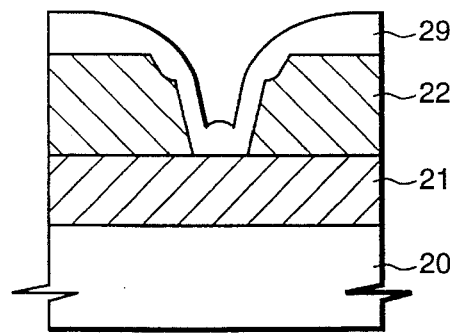

FIG. 2F illustrates a step of forming second conductive layer 29. This step is carried out by depositing a conductive material like aluminum on the resultant structure where the polymer and nonvolatile by-product are completely removed.

Figure 3:
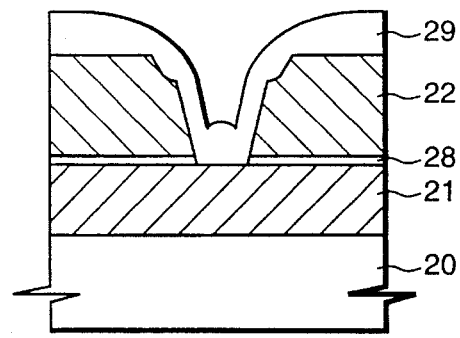
FIG. 3 is a sectional view for illustrating another embodiment of an interconnecting method for a semiconductor device of the present invention.

FIG. 3 is a sectional view of another embodiment of the interconnecting method for a semiconductor device of the present invention. In FIG. 3, a conductive material like TiN is deposited on lower conductive layer 21 containing aluminum, thereby forming TiN layer 28. This step is for reducing the reflectance of the lower conductive layer containing aluminum during lithography for patterning the lower conductive layer, and to thereby enhance the resolution of the photoresist.

As described above, in the interconnecting method of the present invention, a gaseous mixture of fluorocarbon-containing gas and oxygen is used to etch an insulating layer formed on a conductive layer containing aluminum, so that polymers and/or nonvolatile by-products, which are generated when an opening in the insulating layer (e.g., a via hole) is formed, can be completely removed. This enhances the yield and reliability of a semiconductor device. Further, since the opening has a tapered sidewall profile, the step coverage is improved.

What is claimed is:

1. An interconnecting method for a semiconductor device comprising the steps of:

forming a first conductive layer containing aluminum on a lower structure;

forming an insulating layer on said conductive layer;

forming a photoresist pattern on said insulating layer which exposes said insulating layer on a portion where an opening is to be formed;

isotropically etching part of said insulating layer by wet etching, using said photoresist pattern as an etching mask;

anisotropically etching the remainder of said isotropically etched insulating layer by reactive ion etching using $O_2$ and $CHF_3$ as etching gases such that the diameter of said opening tapers downward;

over-etching the resulting structure using $O_2$ and $CF_4$ as etching gases to ensure complete exposure of said conductive layer by said opening;

RIE-sputtering the resulting structure using $O_2$ and $CHF_3$ as etching gases to remove a polymer and a nonvolatile by-product and said photoresist pattern.

2. An interconnecting method for a semiconductor device as claimed in claim 1, wherein said over-etching step is performed under a condition where the etching rates of said photoresist and said insulating layer are approximately the same.

3. An interconnecting method for a semiconductor device as claimed in claim 1, wherein said RIE sputtering step is performed under a condition where the etching rate of said photoresist is about 5 times higher than that of said insulating layer.

4. An interconnecting method as claimed in claim 1, further comprising, after said first conductive layer forming step, a step of forming a titanium nitride layer on said conductive layer.

* * * * *